(12) United States Patent
Tung

(10) Patent No.: US 6,592,019 B2
(45) Date of Patent: Jul. 15, 2003

(54) PILLAR CONNECTIONS FOR SEMICONDUCTOR CHIPS AND METHOD OF MANUFACTURE

(75) Inventor: Francisca Tung, Austin, TX (US)

(73) Assignee: Advanpack Solutions Pte. Ltd, Singapore (SG)

( * ) Notice: Subject to any disclaimer, the term of this patent is extended or adjusted under 35 U.S.C. 154(b) by 0 days.

(21) Appl. No.: 09/843,248

(22) Filed: Apr. 26, 2001

(65) Prior Publication Data
US 2002/0033412 A1 Mar. 21, 2002

Related U.S. Application Data

(63) Continuation-in-part of application No. 09/564,382, filed on Apr. 27, 2000.

(51) Int. Cl.$^7$ ............................................... B23K 31/00
(52) U.S. Cl. ..................................................... 228/197
(58) Field of Search ............................. 228/180.22, 254, 228/123.1, 193–195, 197; 29/840; 361/779, 772, 760, 767, 774; 257/737, 778, 777

(56) References Cited

U.S. PATENT DOCUMENTS

| | | | |
|---|---|---|---|
| 5,075,965 A | 12/1991 | Carey et al. | 29/840 |
| 5,130,779 A | 7/1992 | Agarwala et al. | 357/67 |
| 5,334,804 A | 8/1994 | Love et al. | 174/267 |
| 5,342,495 A * | 8/1994 | Tung et al. | 204/297.03 |
| 5,536,362 A | 7/1996 | Love et al. | 156/643.1 |
| 5,736,074 A * | 4/1998 | Hayes et al. | 264/6 |
| 5,773,889 A | 6/1998 | Love et al. | 257/737 |
| 5,773,897 A | 6/1998 | Wen et al. | 257/778 |
| 5,790,377 A | 8/1998 | Schreiber et al. | 361/704 |
| 5,796,591 A * | 8/1998 | Dalal et al. | 228/180.22 |
| 5,807,766 A | 9/1998 | McBride | 438/119 |
| 5,881,945 A * | 3/1999 | Edwards et al. | 228/124.6 |
| 6,196,443 B1 | 3/2001 | DiGiacomo | 228/180.22 |

FOREIGN PATENT DOCUMENTS

| | | | |
|---|---|---|---|
| EP | 0602328 A2 | 9/1993 | H01L/21/60 |
| EP | 0889512 A2 | 4/1998 | H01L/21/48 |
| JP | 04037139 | 5/1992 | H01L/21/321 |

OTHER PUBLICATIONS

"A fine pitch and high aspect ratio bump fabrication process for flip–chip Interconnection," by Yamada et al., Electronic Manaf. Tech. Symp., 1995, Proceedings of 1995 Japan Int'l, 18th IEEE/CPMT Int'l Omiya, Japan, Dec. 4–6, 1995, New York, NY, USA, IEEE, pp. 121–124 XP010195564.

"Wire Interconnect Technology, a New High–Reliability Tight–Pitch Interconnect Technology," a paper by Love et al., Fijitsu Computer Packaging Technologies, Inc., San Jose, CA, No Date Avail.

* cited by examiner

*Primary Examiner*—Tom Dunn
*Assistant Examiner*—Jonathan Johnson
(74) *Attorney, Agent, or Firm*—George O. Saile; Stephen B. Ackerman

(57) ABSTRACT

A flip chip interconnect system comprises an elongated pillar comprising two elongated portions, a first portion including solder with or without lead and a second portion including copper or gold or other material having a higher reflow temperature than the first portion. The second portion is to be connected to the semiconductor chip and has a length preferably of more than 55 microns to reduce the effect of α particles from the solder from affecting electronic devices on the chip. The total length of the pillar is preferably in the range of 80 to 120 microns.

9 Claims, 6 Drawing Sheets

PILLAR CONNECTIONS FOR SEMICONDUCTOR CHIPS AND METHOD OF MANUFACTURE

CROSS REFERENCE TO RELATED APPLICATION

This application is a continuation-in-part to U.S. patent application Ser. No. 09/564,382, filed Apr. 27, 2000, which is incorporated herein in its entirety.

BACKGROUND OF THE INVENTION

This invention relates in general to interconnections for semiconductor devices and, in particular, to pillar-shaped connections from a semiconductor chip to a substrate and method for making the connections.

Tin lead based solders is the preferred interconnect material of choice for flip chip bonding of silicon integrated circuits. As dimensions of the electronic devices on the silicon integrated circuits are continually reduced, $\alpha$ particle emissions by lead can cause significant problems. Lead has three stable isotopes which are formed as the end products of natural radioactive decay chains. These stable isotopes, however, usually contain a small amount of residual $\alpha$ particle radioactivity. As the dimensions of electronic devices in silicon integrated circuits become smaller, the distances between the lead-based solder and the devices are also reduced so that the $\alpha$ particle emission from the solder can cause such devices to malfunction.

One way to reduce the effect of $\alpha$ particle emission from solder is to provide a passivation layer covering the electronic devices on silicon. Some materials used for the passivation layer are more effective than others for preserving the integrity of the electronic devices from the $\alpha$ particles. Furthermore, the residual $\alpha$ particle emission from the solder radiate from essentially point sources in the solder, so that the intensity of $\alpha$ particle emission experienced by the electronic devices decreases rapidly with the distances separating the devices from the solder. Shown below is a table setting forth five different materials serving as the medium separating electronic devices from the solder.

| MEDIA (Compound) | Density $\rho(g.cm^{-3})$ | Mol. Wt. $M(g)$ | -dE/dx $(eV.cm^2/1e15\ atoms)$ | Effective Thickness d(Cm) |
|---|---|---|---|---|
| Air | 1.161e-03 | 39.11 | 20.96 | 10.83 |
| Polyimide | 1.61 | 38.0 | 18.91 | 0.0084 |
| Epoxy | 1.20 | 40.0 | 19.68 | 0.0114 |
| $SiO_2$ | 2.65 | 60.0 | 27.42 | 0.0055 |
| $Si_3N_4$ | 3.17 | 140.0 | 28.18 | 0.0105 |

As can be seen from the table above, if air is the only medium that separates the electronic devices from the solder, then in order for the electronic devices not to be significantly affected by the $\alpha0$ particle emission from the solder, the effective thickness of the air medium separating the electronic devices and the solder should be at least 10.83 cm, which is unacceptable for most applications. From the above table it will be noted that the best barrier layer substance in terms of minimum absorption length for absorption of $\alpha$ particles from the solder is silicon dioxide, followed by polyimide. Where silicon dioxide or another solid material is used as the passivation layer, only part of the medium separating the electronic devices from the solder is occupied by the material, with the remaining part occupied by air or another material not as effective in absorbing $\alpha$ particles. It will be noted from the table, however, that even where silicon dioxide is used as a compound for the passivation layer covering the electronic devices on silicon, it is preferable that the electronic devices and the solder be separated by at least 0.0055 cm or 55 microns. For polyimide passivation layers, the separation is preferably at least 84 microns.

Conventional interconnect methods employ lead-based solders for connecting flip chips to substrates. Aside from the $\alpha$ particle emission problem described above, as the structural dimensions of electronic devices get smaller, the use of lead-based solder bumps is disadvantageous also because it may be difficult to achieve a fine pitch between adjacent interconnects without bridging which causes electrical shorting. When the solder bump is formed by electroplating, and where the photoresist is not thicker than 60 microns, the bump size in the horizontal plane of a 100 micron high solder ball will be around 120 microns, and the plated solder bump is in the shape of a mushroom. Therefore, if the pitch or distance between adjacent interconnects using solder bumps of such height is reduced to below 150 microns in either the array or peripheral format, bump bridging can easily occur. It is, therefore, desirable to provide an improved interconnect system to achieve finer pitch with minimum probability of bump bridging and where $\alpha$ particle emission will not significantly affect the functions of electronic devices on the semiconductor chips.

In the document entitled "Wire Interconnect Technology, A New High-Reliability Tight-Pitch Interconnect Technology," by Love et al., from Fujitsu Computer Packaging Technologies, Inc. an all copper interconnect post is proposed. Instead of using lead based solder, the flip chip is connected to a substrate by means of an all copper post which is about 45 or 50 microns in length. While such copper-based interconnects may be able to achieve a finer pitch between adjacent interconnects, such proposed solution still does not avoid the problem of the $\alpha$ particle emission described above. As shown in FIG. 1 of the article by Love et al., solder is used to attach the copper posts to the substrate. Since the height of the copper post or pillars is not more than 50 microns in height, even where silicon dioxide is used as the passivation layer covering the electronic devices on the flip chips, the electronic devices may still be adversely affected by $\alpha$ particle emission by the solder used to attach the copper posts to the substrate. Furthermore, as known to those skilled in the art, the space between the semiconductor flip chip and the substrate is usually filled with an underfill material to provide support and stability to the interconnect structure. Typically, the process of providing the underfill material is by injection that requires a certain minimum separation between the semiconductor chip and the substrate. For most injection processes, the minimum separation is about 75 microns. Therefore, using the interconnect structure proposed by Love et al. in the article, there appears to be inadequate separation between the semiconductor chip and the substrate for injecting the underfill material. The process employed by Love et. al appears to limit the height of the copper post achievable to not more than 50 microns.

None of the above-described interconnect systems is entirely satisfactory. It is, therefore, desirable to provide an improved interconnect system in which the above-described difficulties are not present.

SUMMARY OF THE INVENTION

This invention is based on the observation that an elongated pillar may be advantageously used for connecting a semiconductor chip to a substrate, where the pillar comprises two elongated portions, one portion including a metal material that does not include lead, such as a material including copper, higher reflow temperature solder or gold, and another portion including solder or other wettable material. The portion including the non-lead metal material is in contact with the semiconductor chip and has a length not less than about 50 microns. Preferably, the total length of the pillar is not less than about 55 microns. In a more preferred embodiment, the length of the pillar is not less than about 84 microns, with the length of the portion of the pillar including copper not less than about 55 microns.

Using the elongated pillar of this invention, the separation between the solder in the pillar or any other solder used in the interconnect on the one hand and electronic devices on the semiconductor chip on the other hand can be made to exceed 55 microns or even 84 microns so that adverse effects caused by α particle emission from the solder on the electronic devices on the semiconductor chip will be reduced. This is especially the case where silicon dioxide or polyimide is used as the passivation layer.

In the case where alpha particle is not a concern, all portions of the interconnect can be of made of solder material containing lead in elongated pillar shape.

Where the length of the pillar exceeds 75 microns, adequate separation is provided between the semiconductor chip and the substrate for the injection of the underfill material. Furthermore, by providing elongated pillars of adequate length and suitable cross-sectional dimensions connecting the semiconductor chip to the substrate, the stress induced in the connection between the semiconductor chip and the pillar due to warpage is much reduced, which also reduces the chances of chip failure caused by shear stress on account of the warpage.

The elongated pillar may be formed by first depositing a layer of metal for plating purposes and followed by forming a layer of photosensitive material on the chip and exposing to radiation the layer of photosensitive material at predetermined areas. Portions of the layer that are exposed to radiation are removed to form through holes in the layer. Portions of the holes are filled with a material containing a metal to form an elongated column in contact with the chip. The metal material is different from top layer metal (and preferably does not include lead.) Portions of the holes are then filled with a material containing any wettable metal to form an elongated column of metal in contact with the bottom portion material, thereby forming a composite pillar, a portion of which includes the metal material and another portion of which includes a wettable metal. The photosensitive layer and deposited layer of metal for plating purposes are then removed to form the elongated pillars. After the pillars have been formed, the pillars may or may not be reflowed prior to being connected to the substrate. Preferably, the filling of the holes of the photosensitive material layer with copper, gold, non lead or solder is done by electroplating. Also preferably the thickness of the photosensitive layer and the depth of the holes therein are such that they are adequate to form the pillars of sufficient height, such as the ones described above.

To enhance the reliability of the portions of the pillars including the metal material, it may be desirable to provide a layer of material covering such portions; the metal material is different from solder and preferably does not include lead. Where such portions include copper, this may be achieved by forming a layer of copper oxide on the sidewall surface of such portion of at least one of the pillars. The copper oxide will also reduce wetting of the sidewall surface during solder reflow, thereby facilitating control of the height of the solder portion of the at least one pillar during solder reflow.

Another aspect of the invention is directed to a flip chip interconnect system for use with a semiconductor chip. Two elongated portions may be employed: a first portion including solder, non lead solder or a wettable material including nickel and gold, and a second portion containing a material with higher reflow temperature than that of the first portion, said second portion in contact with the semiconductor chip. The second portion may or may not contain lead.

Yet another aspect of the invention is directed to a flip chip interconnect system for use with a semiconductor chip, comprising an elongated portion in contact with semiconductor chip and a ball-shaped portion, said elongated portion including copper, or a solder metal with higher reflow temperature than the ball-shaped portion, said ball shaped portion include a solder material. The elongated portion may or may not contain lead.

BRIEF DESCRIPTION OF THE DRAWINGS

For simplicity in description, identical components are identified by the same numerals.

DETAILED DESCRIPTION OF THE PREFERRED EMBODIMENTS

Figure 1A:
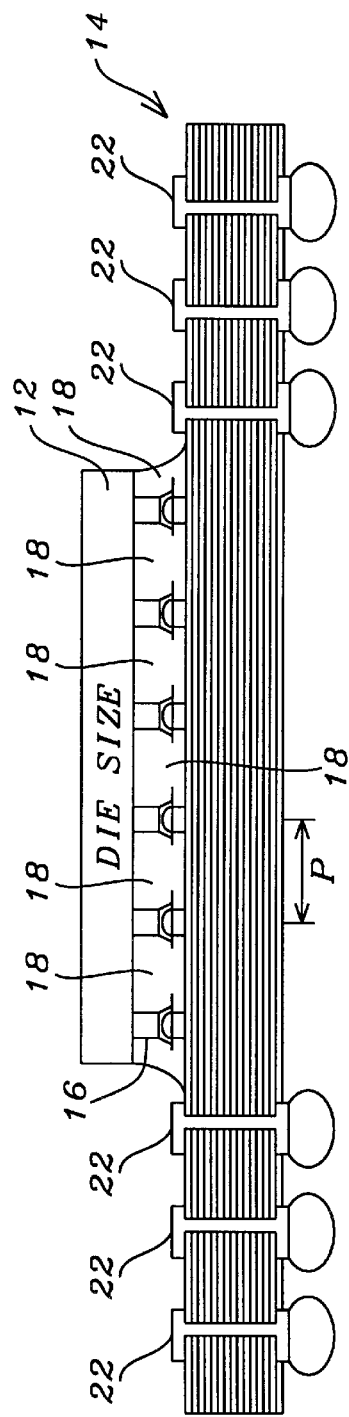
FIG. 1A is a cross-sectional view of a flip chip connected to a substrate using the elongated pillars of this invention to illustrate the invention.

FIG. 1A is a cross-sectional view of a semiconductor die in the form of a flip chip 12 connected to a substrate 14 by means of elongated pillars 16 to illustrate an embodiment of the invention. As shown in FIG. 1A, the space between the die 12 and substrate 14 is filled with an underfill material 18 such as one known to those of skill in the art to provide support and stability to the die and interconnect structure formed by the elongated pillars 16.

Figure 1B:
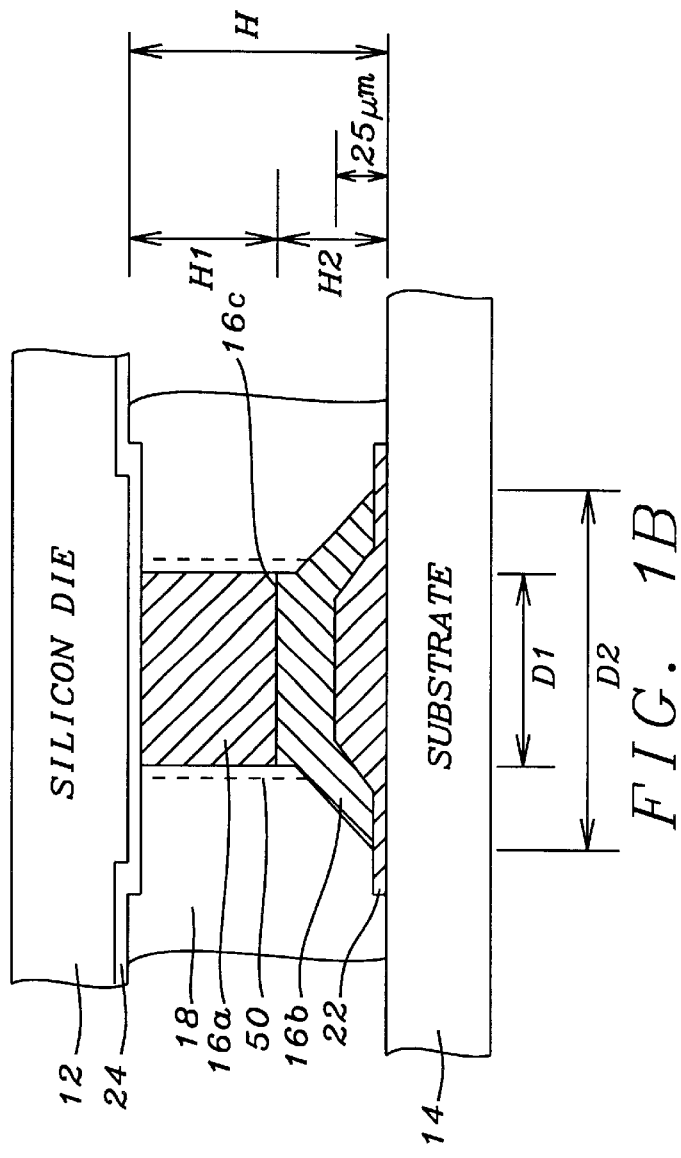
FIG. 1B is an exploded view of a portion 1B of the system of FIG. 1A showing in more detail the interconnection between the elongated pillar, the silicon die and the substrate.

FIG. 1B is an exploded view of a portion 1B of the system of FIG. 1A showing in more detail an elongated pillar connecting a portion of the silicon die to the substrate. As shown in FIG. 1B, pillar 16 comprises two parts: an upper elongated portion 16a comprising copper of height H1 and a second elongated portion of height H2 comprising a lead-based solder. The junction between the two portions 16a, 16b is at 16c. The bottom part of portion 16b is enlarged compared to its upper part and has a substantially conical shape where the bottom part of the solder portion of 16b is the result of a reflow process as described below to make physical and electrical contact with the copper contact layer 22 on top of substrate 14. The upper end of portion 16a is in attached to a copper contact 24 on the silicon die 12. In this manner, circuits on the silicon die 12 are electrically connected through pillar 16 to a copper contact 22 on the substrate 14. As shown in FIGS. 1A and 1B, the space between the semiconductor die 12 and substrate 14 is filled with an underfill material 18.

As shown in FIG. 1B, circuits (not shown) on the silicon die 12 are spaced apart from the solder portion 16b by the length or height of portion 16a containing copper. The surface of the silicon die 12 facing the substrate is coated with a passivation layer (not shown) made of a suitable material such as silicon dioxide or polyimide. Therefore, if the length or height H1 of portion 16a exceeds the effective thickness shown in the table above, then the circuits on die 12 will not be significantly adversely affected by the α particle emission from solder 16b. In the preferred embodiment, the height H1 of the portion 16a is not less than 55 microns, where silicon dioxide is used as the passivation layer, and more preferably, more than 84 microns where polyimide is used as the passivation layer. To permit many injection processes to be used for injecting the underfill material 18, the total height H of pillar 16 between die 12 and the substrate 14 is at least 75 microns, such as in the range of about 80–100 microns. For reasons discussed below, a larger value for H would reduce the shear stress experienced by the silicon die and the connection between the die 12 and pillar 16. Thus, it may be preferable for the total height H of the pillar to be at least 100 microns, and more preferably 120 microns or more, such as 125 microns. It may be preferable for the ratio H1 to H2 to be about 3 to 1.

FIGS. 2A–2G are cross-sectional views of a semiconductor die and the various layers associated therewith to illustrate the process for making the elongated pillar interconnect shown in FIGS. 1A, 1B and of process for connecting the pillar to a substrate to illustrate the invention.

Figure 2A:
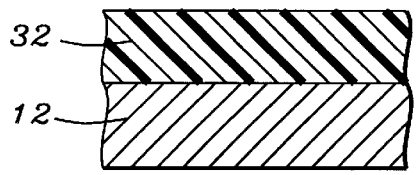
FIGS. 2A–2G are cross-sectional views of a portion of a semiconductor die and various layers associated with the die at various stages of fabrication to illustrate a process for making the elongated pillars attached to the die and the attachment of such pillars to a substrate to illustrate an embodiment of the invention.
Figure 2E:
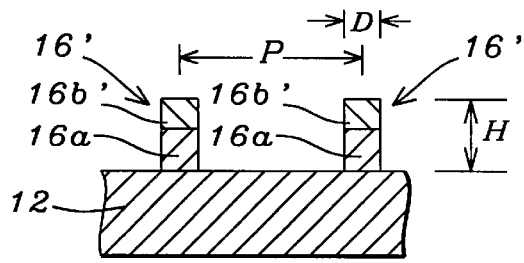
Figure 2B:
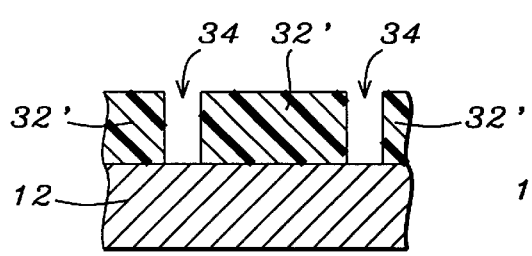
Figure 2F:
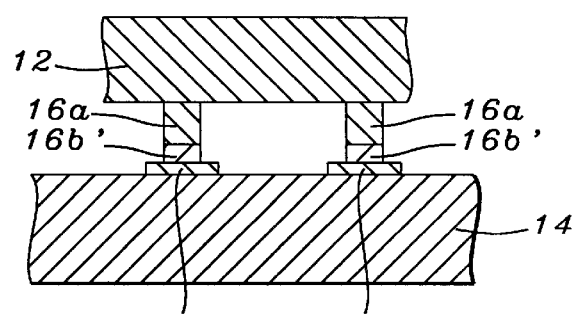
Figure 2C:
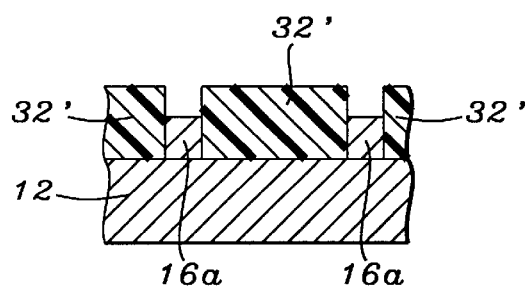
Figure 2G:
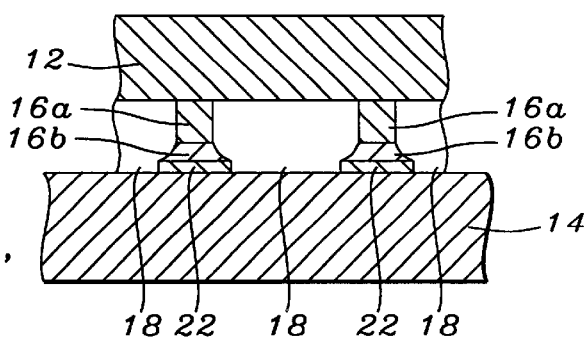
Figure 2D:
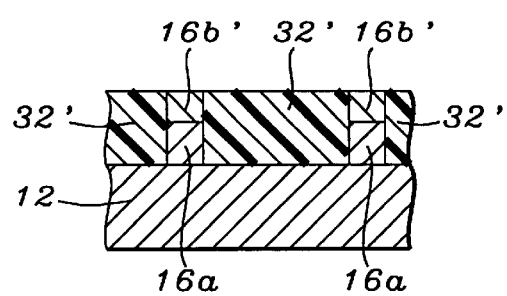

As shown in FIG. 2A, a photosensitive layer 32 is formed on the die 12. To simplify the drawing, only portions of the die and of the various layers are shown in FIGS. 2A–2G. Various designated areas of the photosensitive layer are exposed to radiation, and the portions that are exposed to radiation are then removed to yield layer 32' with a pattern of through holes 34 therein as shown in FIG. 2B, where the through holes reach all the way to die 12. Portions of the through holes 34 are filled with a material including copper, such as by placing the entire structure in a copper bath. An electric current is passed there through to perform electroplating of the copper material to fill at least a portion of each hole 34 as shown in FIG. 2C. As shown in FIG. 2C, copper material 16a fills a portion of each of holes 34. The entire structure is then transferred to a bath of material containing solder and electroplating is again employed to fill portions of holes 34, resulting in the structure shown in FIG. 2D, where a solder material 16b40 fills portions of the holes 34. The photosensitive remaining layer 32' is then removed to form the structure of FIG. 2E. As shown in FIG. 2E, two elongated pillars 16' are then formed, each comprising a copper portion 16a and a solder portion 16b'. To connect the pillars to the substrate, portions 16b' are placed in contact with the copper contacts 22 on the substrate 14 as shown in FIG. 2F. The portions 16b' containing solder are then heated in a manner known to those skilled in the art to reflow the solder 16b' to form the solder portions 16b and pillars 16 as shown in FIGS. 1B and 2G. An underfill material 18 is then injected to fill the space between die 12 and substrate 14. Contacts 24 on die 12 are, therefore, physically and electrically connected and attached to contacts 22 on the substrate 14. The resulting structure is illustrated in FIG. 2G.

To provide a metal contact between the pillars and the semiconductor die, an underbump metalization layer (typically composed of a material including Titanium (Ti), titanium-tungsten (TiW), or chromium (Cr) and copper function as an adhesion layer during the above-described process. This layer also serves as the conducting metal contact for the copper portions of the pillars for the above-described electroplating process. After the photosensitive layer 32' has been removed, all portions of this underbump metalization layer, except for the portions underneath the pillars are removed. For simplicity, this layer has been omitted from the figures.

The spacing or pitch P between adjacent elongated pillars 16 is as illustrated in FIGS. 1A and 2E, Using the process described above, fine pitch of not more than 100 microns is achievable; preferably, the pitch or spacing between adjacent pillars is in the range of about 80 to about 100 microns. Since solder forms a portion of the pillar, no extra process of placing solder on the substrate is required, and the connection between the pillar and the substrate can be simply formed by reflowing the solder portion of the pillar. Furthermore, through this process, no mushroom solder bump is formed so that finer pitch can be achieved. The solder composition is flexible and can be 63/37 or 5/95 SnPb ratio, or a non-lead solder. The copper material and solder material used in the above-described electroplating processes may simply be copper metal and solder.

Figure 3A:
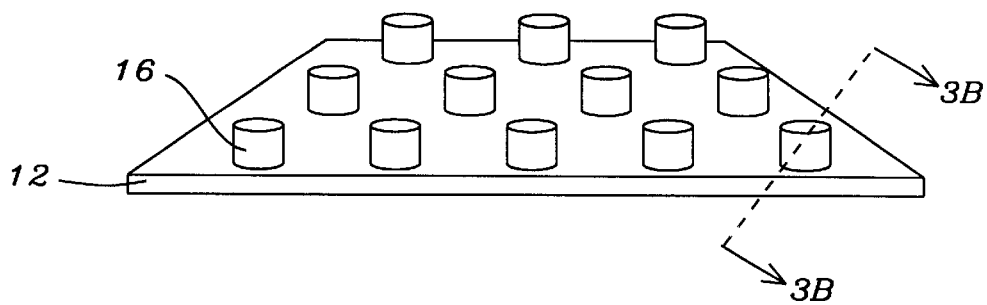
FIG. 3A is a perspective view of a flip chip with elongated pillars on one side of the chip to illustrate an embodiment of the invention.
Figure 3B:
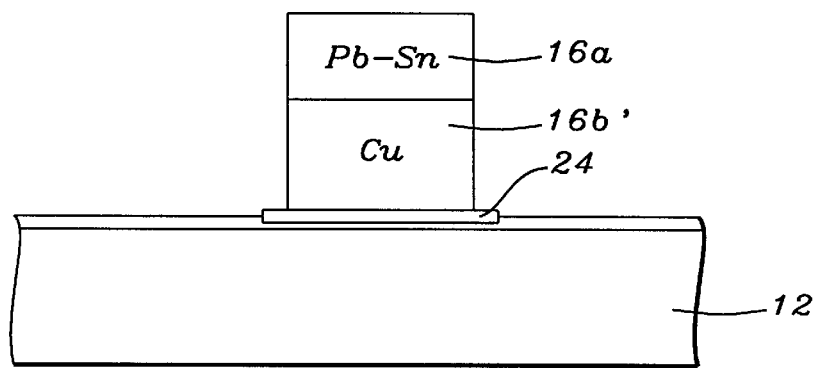
FIG. 3B is a cross-sectional view of a portion 3B of the chip of FIG. 3A to illustrate the embodiment of the invention.
Figure 3C:
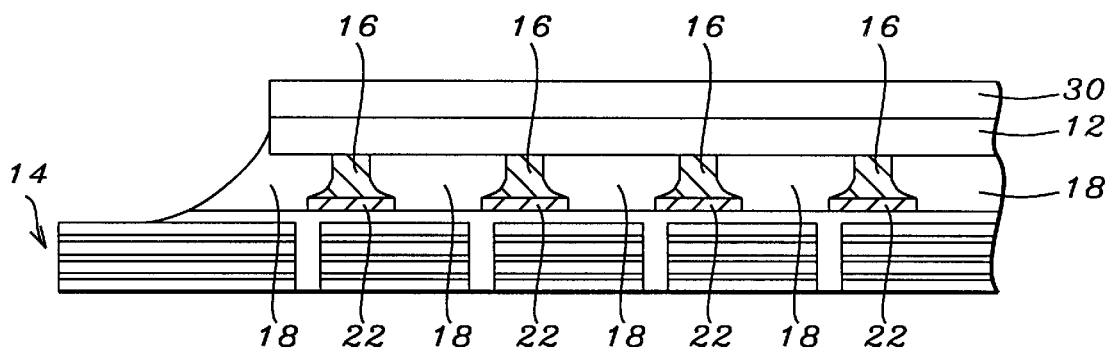
FIG. 3C is a cross-sectional view of a portion of the flip chip and the substrate after the flip chip has been attached to the substrate and the underfill material injected to illustrate an embodiment of the invention.

FIG. 3A is a perspective view of a flip chip with elongated pillars on one side of the chip to illustrate an embodiment of the invention. FIG. 3B is a cross-sectional view of a portion 3B of the chip of FIG. 3A to illustrate the embodiment of the invention. FIG. 3C is a cross-sectional view of a portion of the flip chip and the substrate after the flip chip has been attached to the substrate and the underfill material injected to illustrate an embodiment of the invention, as indicated by arrow 100.

Figure 4A:
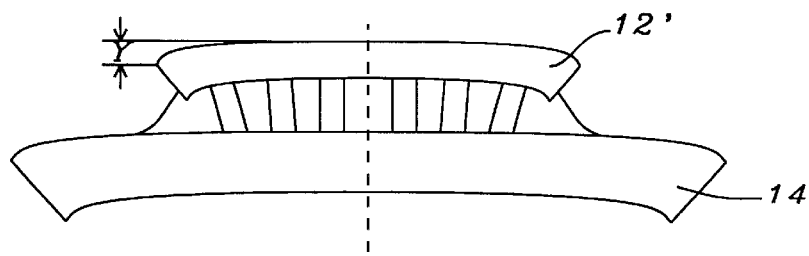
FIG. 4A is a cross-sectional view of a flip chip connected to a substrate where both the flip chip and the substrate are warped to illustrate the shear stress in the chip.
Figure 4B:
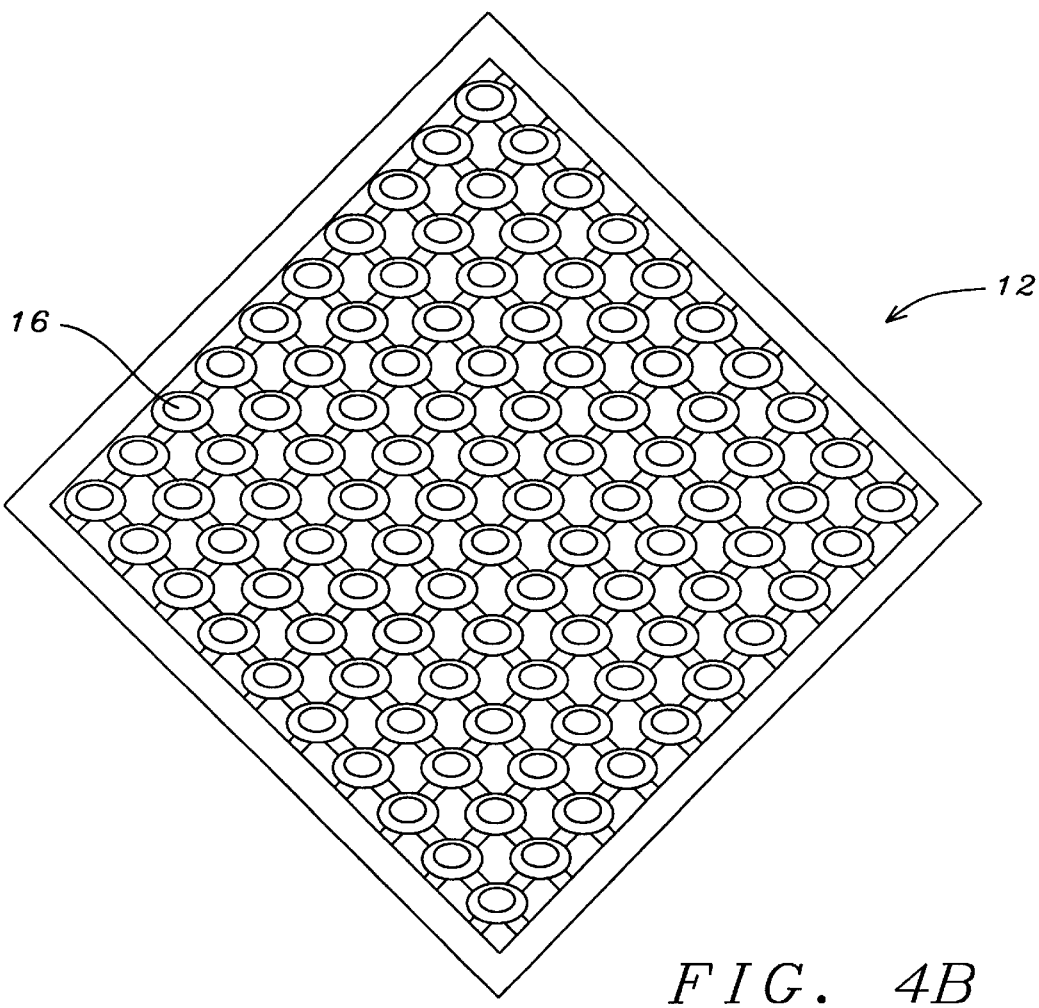
FIG. 4B is a top view of the flip chip of FIG. 4A.

Another advantage of the elongated pillar interconnects of this invention is that it reduces shear stress experienced by warped silicon dies and the connection between the dies and the interconnects. This is illustrated in FIGS. 4A, 4B. FIG. 4A is a cross-sectional view of a flip chip connected to a substrate where both the flip chip and the substrate are warped to illustrate the shear stress in the chip. FIG. 4B is a top view of the flip chip of FIG. 4A. As shown in FIG. 4A, the silicon die 12' and substrate 14' may become warped for a number of reasons, such as due to thermal effects. Warpage is calculated as Y displacement from center 12a' to the corner 12b' of the die as shown in FIG. 4A.

Figure 5A:
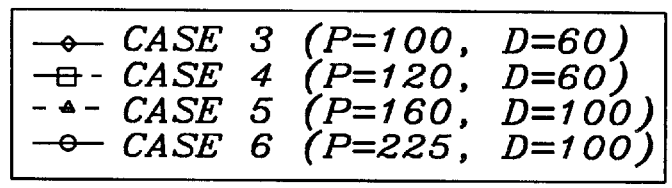
FIGS. 5A and 5B are graphical illustrations of shear stress distribution for a 20 mm die where the die is connected to a substrate using elongated pillars of this invention of 100 microns in height and bump diameter of 60 and 100 microns, and at a bump pitch of 100/120/160/225 microns to illustrate the invention.
Figure 5A:
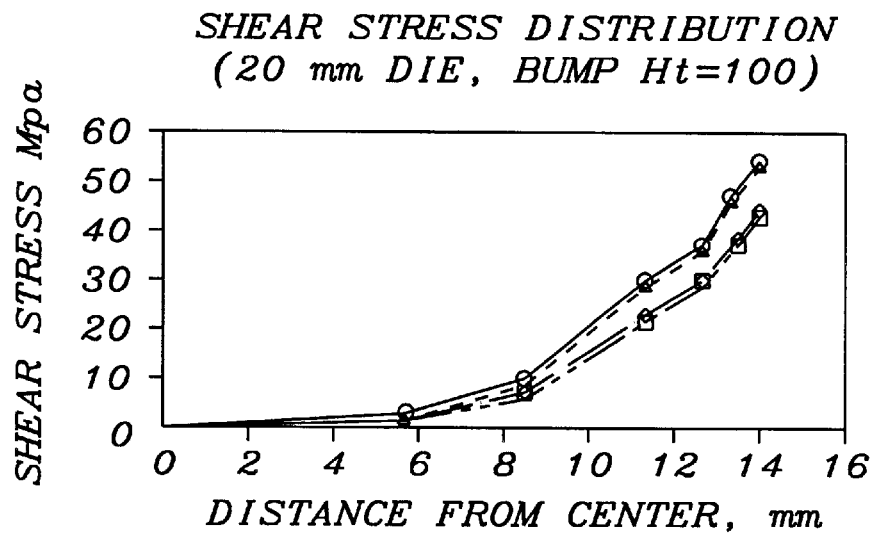
Figure 5B:
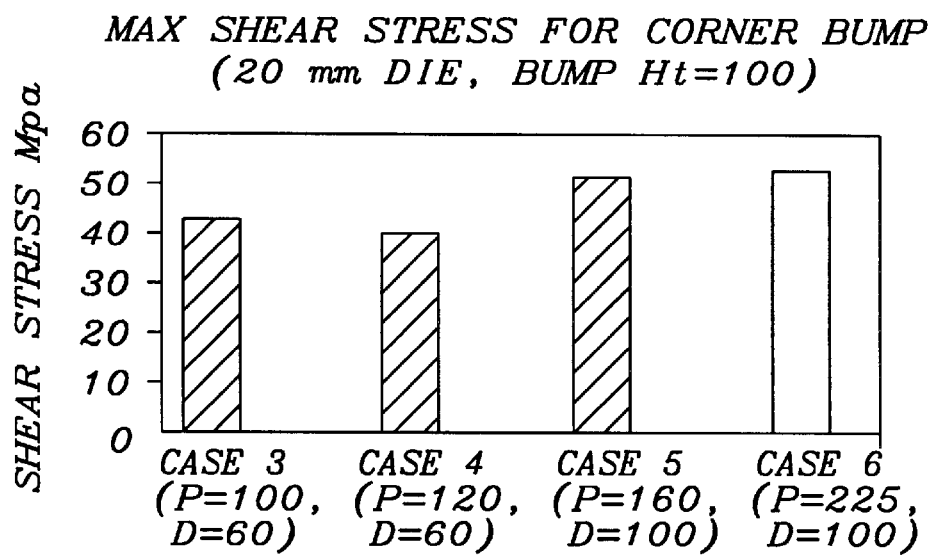
Figure 6A:
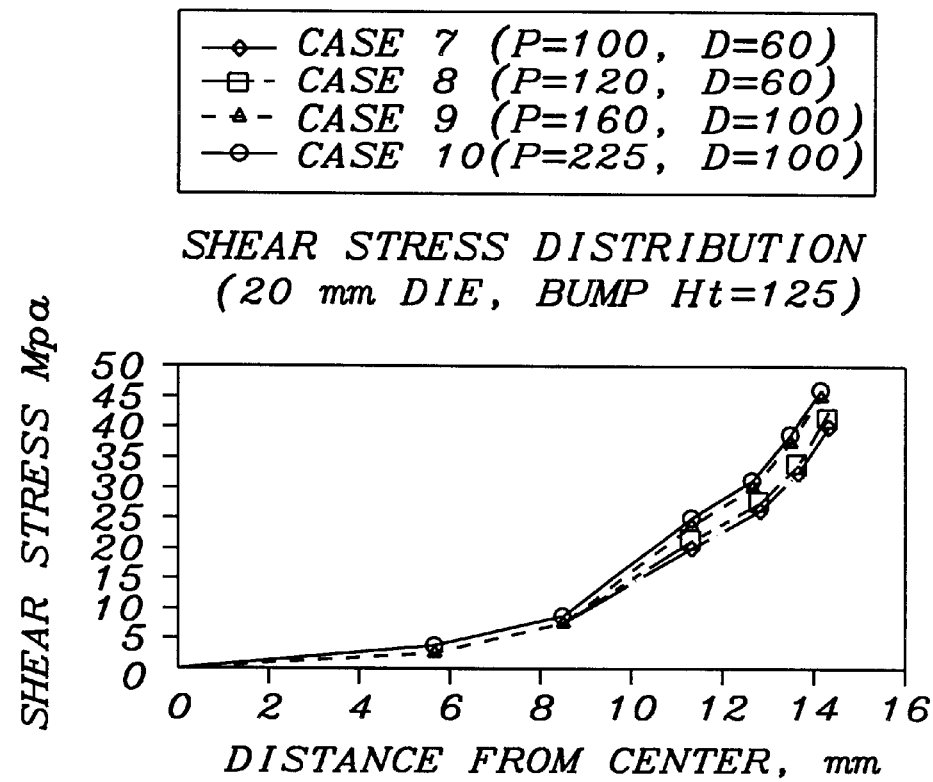
FIGS. 6A and 6B are graphical illustrations of the shear stress in the semiconductor die similar to that shown in FIGS. 5A and 5B except that the height of the elongated pillar is 125 microns instead of 100 microns.
Figure 6B:
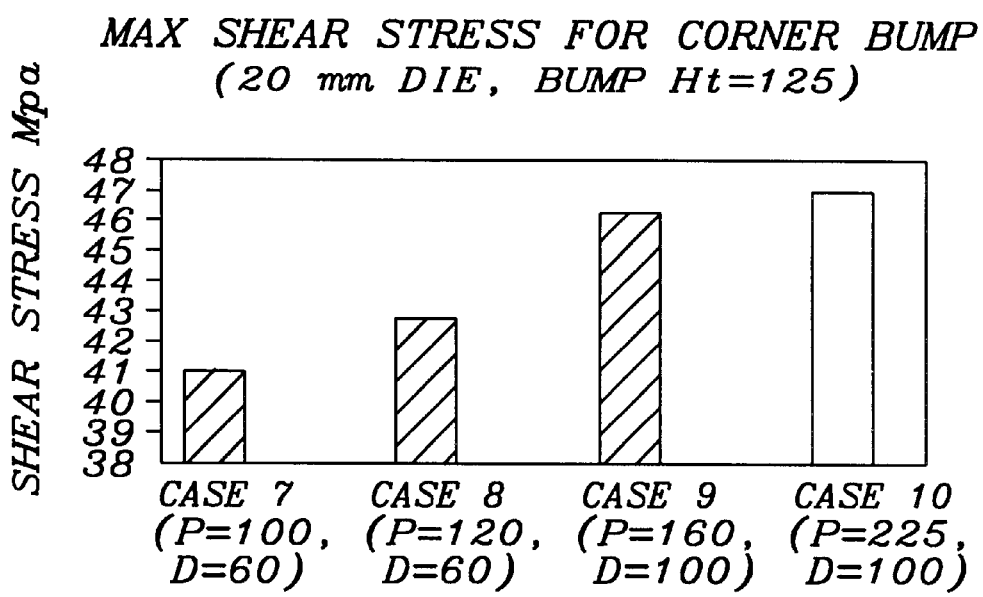

FIGS. 5A and 5B are graphical plots illustrating shear stress distribution in a die of size 20 mm, where elongated pillars of 100 microns in length and diameters of 60 and 100 microns and at bump pitches of 100, 120, 160, 225 microns. In the graphical plot, pitch is represented as P and diameter is represented by D. As shown in FIGS. 5A and 5B, the peak shear stress at the edge of the die is less than the shear strength of copper so that the elongated pillars of this invention should not fail with the given geometry illustrated, or similar geometries, due to shear stress. FIGS. 6A and 6B illustrate similar data to those shown in FIGS. 5A and 5B but where the pillar height or length is 120 microns instead of 100 microns. A comparison of FIGS. 6A and 6B to those of FIGS. 5A and 5B will illustrate that the longer the pillars, the less will be the shear stress experienced at the edge of the die and the interconnects connected to the die.

A layer 50 shown in FIG. 1B of either organic or metal material may be used to cover the copper portion 16a. This will reduce reliability problems. The material used may be Entek or palladium, and may be formed by simply dipping the entire structure (i.e. die 12 and pillar 16) into a bath of such material, where the material will only adhere to the copper portion 16a.

It is found that during reflow of the solder as described above in order to connect the die to the substrate, the sidewall surface of the copper portion 16a may become wetted by solder. When this happens, the solder portion may change in height or even collapse so that the reflow and connection process is more difficult to control. Preferably, the sidewall surface of the copper portion 16a of pillar 16 is oxidized, thereby forming a layer of copper oxide on the sidewall surface. This reduces the chances that the sidewall surface of portion 16a will become wetted by solder during reflow. The layer of copper oxide can be formed by placing the pillars and the die, such as the components shown in FIG. 2E, in an oven heated to a temperature in the range of about 90 to 120 degrees Celsius, such as about 100 degrees Celsius, exposed to an environment that contains oxygen, such as air, for a time period in the range of about 15 to 60 minutes, such as about 30 minutes. While the embodiments have been described above using copper as the non-lead metal material to form the portion(s) of the pillar(s) in contact with the semiconductor chip, it will be understood that metals other than copper such as gold, Sn/Ag, and Sn/Cu can be used as well; such and other variations are within the scope of the invention.

As shown in FIG. 1B, the bottom part of portion 16b is enlarged as a result of a reflow process of the solder. Thus, initially the portion 16b may take the shape of an elongated column. This column may be reflowed to form a ball-shape (shown in dotted lines 16b" in FIG. 1B) prior to being placed in contact with the substrate system. Then the ball-shaped material is reflowed to form the shape shown in FIG. 1B.

Still other variations are possible. Thus, as long as the material in the portion 16a has a higher reflow temperature than portion 16b, the above described process is possible and can be advantageously used. Thus portion 16a may contain copper or a solder material with such higher reflow temperature. Where α particle emission is not a concern, portion 16a may also contain lead. Portion 16b may contain a solder material with or without lead. It may also comprise a wettable material that includes nickel and gold. Any one of such features may be advantageously combined with the above described features.

While the invention has been described above by reference to various embodiments, it will be understood that changes and modifications may be made without departing from the scope of the invention, which is to be defined only by the appended claims and their equivalents.

What is claimed is:

1. A method for making electrical connections to a semiconductor chip, comprising:
    forming a layer of photosensitive material over the chip;
    exposing the layer to radiation at predetermined areas and removing portions of the layer that are exposed to radiation to form through holes in the layer, thereby exposing areas of the chip through the holes;
    filling portions of the holes with a metal to form an elongated column of metal material, so that the metal material is in contact with the chip;
    filling portions of the holes with solder to form an elongated column of solder, so that the solder is in contact with the metal material; and
    removing the layer.

2. The method of claim 1, wherein the filling is performed by a process that includes electroplating.

3. The method of claim 2, wherein the forming forms a layer of photosensitive material that is not less than about 50 microns in depth, and the filling with the metal material is performed so that the elongated column of metal material is not less than about 50 microns in length.

4. The method of claim 1, wherein the forming forms a layer of photosensitive material that is not less than about 50 microns in depth, and the filling with the metal material and solder is performed so that the total length of the elongated column of metal material and of the column of solder is not less than about 55 microns in length.

5. The method of claim 1, wherein the forming forms a layer of photosensitive material that is not less than about 50 microns in depth, and the filling with the metal material and solder is performed so that the total length of the elongated column of metal material and of the column of solder is not less than about 100 microns in length.

6. The method of claim 1, further comprising placing the solder in contact with a substrate and applying heat to the solder to reflow the solder.

7. The method of claim 6, further comprising reflowing the column of solder to form a ball shape body prior to placing it in contact with the substrate.

8. The method of claim 1, further comprising forming a layer of material on a side surface of the metal material.

9. A method for making electrical connections to a semiconductor chip, comprising:
    forming a plurality of pillars connected to a semiconductor chip, each of said pillars comprising at least two elongated portions, a first portion including a metal material, and a second portion including solder,
    wherein said metal material is different from the material in the second portion,
    wherein said first portion is in contact with the semiconductor chip,
    and wherein said second portion comprises a ball-shaped portion including a solder material, said first portion containing a material with a higher reflow temperature than the material of the ball-shaped portion; and
    providing a layer of material on a side surface of the first portion of at least one of the plurality of pillars, by heating the metal material in an environment that contains oxygen, to an elevated temperature, to oxidize the metal material.

* * * * *